United States Patent

Hause et al.

[11] Patent Number: 6,060,345
[45] Date of Patent: *May 9, 2000

[54] METHOD OF MAKING NMOS AND PMOS DEVICES WITH REDUCED MASKING STEPS

[75] Inventors: Frederick N. Hause; Robert Dawson; H. Jim Fulford, Jr., all of Austin; Mark I. Gardner, Cedar Creek; Mark W. Michael, Cedar Park; Bradley T. Moore; Derick J. Wristers, both of Austin, all of Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/844,924

[22] Filed: Apr. 21, 1997

[51] Int. Cl.$^7$ .................................... H01L 21/8238

[52] U.S. Cl. ............................ 438/199; 438/231

[58] Field of Search ................................ 438/199, 229, 438/230, 231, 232, 233, 224, 228, FOR 168, FOR 216, FOR 217, FOR 218, 585, 595

[56] References Cited

U.S. PATENT DOCUMENTS

| | | | |
|---|---|---|---|
| 4,561,170 | 12/1985 | Doering et al. | 438/210 |
| 4,599,789 | 7/1986 | Gasner | 438/231 |
| 4,621,412 | 11/1986 | Kobayashi et al. | 438/227 |
| 4,956,311 | 9/1990 | Liou et al. | 438/231 |
| 4,997,782 | 3/1991 | Bergonzoni | 438/231 |
| 5,036,019 | 7/1991 | Yamane et al. | 438/231 |
| 5,304,504 | 4/1994 | Wei et al. | 438/305 |
| 5,457,060 | 10/1995 | Chang | 438/228 |
| 5,512,506 | 4/1996 | Chang et al. | 438/305 |
| 5,624,863 | 4/1997 | Helm et al. | 438/231 |
| 5,686,324 | 11/1997 | Wang et al. | 438/231 |
| 5,789,787 | 8/1998 | Kadosh et al. | 438/286 |
| 5,834,347 | 11/1998 | Fukatsu et al. | 438/232 |

FOREIGN PATENT DOCUMENTS

| | | |
|---|---|---|
| 0173953 | 3/1986 | European Pat. Off. . |
| 4110645 | 2/1991 | Germany ................................ 27/88 |
| 58-25270 | 2/1983 | Japan ......................... 438/FOR 168 |
| 63-196070 | 8/1988 | Japan ......................... 438/FOR 217 |

OTHER PUBLICATIONS

Silicon Processing for the VLSI ERA—vol. 2: Process Integration, by S. Wolf, published by Lattice Press, Sunset Beach, CA, 1990, p. 436.

*Primary Examiner*—Michael Trinh
*Attorney, Agent, or Firm*—Skjerven, Morrill, MacPherson, Franklin & Friel, LLP; Ken J. Koestner, Esq.

[57] ABSTRACT

A method of making NMOS and PMOS devices with reduced masking steps is disclosed. The method includes providing a semiconductor substrate with a first active region of first conductivity type and a second active region of second conductivity type, forming a gate material over the first and second active regions, forming a first masking layer over the gate material, etching the gate material using the first masking layer as an etch mask to form a first gate over the first active region and a second gate over the second active region, implanting a dopant of second conductivity type into the first and second active regions using the first masking layer as an implant mask, forming a second masking layer that covers the first active region and includes an opening above the second active region, and implanting a dopant of first conductivity type into the second active region using the first and second masking layers as an implant mask. Advantageously, the dopant of first conductivity type counterdopes the dopant of second conductivity type in the second active region, thereby providing source and drain regions of second conductivity type in the first active region and source and drain regions of first conductivity type in the second active region with a single masking step and without subjecting either gate to dopants of first and second conductivity type.

22 Claims, 3 Drawing Sheets

METHOD OF MAKING NMOS AND PMOS DEVICES WITH REDUCED MASKING STEPS

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, the polysilicon is anisotropically etched to provide a gate which provides a mask during formation of the source and drain by ion implantation, and then the implanted dopant is activated using a high-temperature anneal that would otherwise melt the aluminum.

As IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to spacers adjacent to sidewalls of the gate. The spacers are typically oxides or nitrides. The purpose of the lighter first dose is to form a lightly doped region of the drain (or LDD) at the edge near the channel. The second heavier dose forms a low resistivity region of the drain, which is subsequently merged with the lightly doped region. Since the heavily doped region is farther away from the channel than a conventional drain structure, the depth of the heavily doped region can be made somewhat greater without adversely affecting the device characteristics.

Complementary metal-oxide semiconductor (CMOS) circuits include N-channel (NMOS) devices and P-channel (PMOS) devices. Conventional processes typically use N-well masks and P-well masks early in the processing sequence to define the NMOS and PMOS regions. Conventional process also typically include a single masking step for forming the gates over the NMOS and PMOS regions, separate masking steps for implanting lightly doped N-type source/drain regions into the NMOS region and lightly doped P-type source/drain regions in the PMOS region, formation of spacers adjacent to the gates, and then separate masking steps for implanting heavily doped N-type source/drain regions into the NMOS region and heavily doped P-type source/drain regions into the PMOS region.

A procedure has been reported that requires only one masking step for creating source and drain regions in the NMOS and PMOS regions. With this procedure, after the gates are formed, heavily doped P-type source/drain regions are nonselectively implanted into the NMOS and PMOS regions, a mask is formed that covers the PMOS region and exposes the NMOS region, and heavily doped N-type source/drain regions are implanted into the NMOS region which counterdope the P-type source/drain regions in the NMOS region. See SILICON PROCESSING FOR THE VLSI ERA, Volume 2: Process Integration, by S. Wolf, published by Lattice Press, Sunset Beach, Calif., p. 436 (1990). The procedure can be extended to fabricating NMOS and PMOS devices with lightly and heavily doped source and drain regions using three masking steps instead of four. In particular, lightly doped P-type source/drain regions are implanted into the NMOS and PMOS regions, a first mask covers the PMOS region and exposes the NMOS region, lightly doped N-type source/drain regions are implanted into the NMOS region which counterdope the lightly doped P-type source/drain regions in the NMOS region, spacers are formed adjacent to the gates, and heavily doped source/drain regions are implanted into the NMOS and PMOS regions using separate masking steps.

A drawback to this procedure, however, is that the gate for the NMOS device is doped with both N-type and P-type dopants. The dual-doped gate may lead to difficulties, for instance, in obtaining the desired threshold voltage, or in properly forming a gate silicide contact.

Accordingly, a need exists for an improved method of making a N-channel and P-channel devices with reduced masking steps and without subjecting either gate to both N-type and P-type dopants.

SUMMARY OF THE INVENTION

An object of the present invention is to provide N-channel and P-channel devices with reduced masking steps.

In accordance with one aspect of the invention, a method includes providing a semiconductor substrate with a first active region of first conductivity type and a second active region of second conductivity type, forming a gate material over the first and second active regions, forming a first masking layer over the gate material, etching the gate material using the first masking layer as an etch mask to form a first gate over the first active region and a second gate over the second active region, implanting a dopant of second conductivity type into the first and second active regions using the first masking layer as an implant mask, forming a second masking layer that covers the first active region and includes an opening above the second active region, and implanting a dopant of first conductivity type into the second active region using the first and second masking layers as an implant mask.

Advantageously, the dopant of first conductivity type counterdopes the dopant of second conductivity type in the second active region, thereby providing source and drain regions of second conductivity type in the first active region and source and drain regions of first conductivity type in the second active region with a single masking step and without subjecting either gate to dopants of first and second conductivity type.

In accordance with another aspect of the invention, forming sources and drains in the first and second active regions includes implanting lightly doped source and drain regions of second conductivity type into the first active region outside the first gate and into the second active region outside the second gate using the first masking layer as an implant mask for the first and second gates, and implanting lightly doped source and drain regions of first conductivity type into the second active region outside the second gate using the first masking layer as an implant mask for the second gate and the second masking layer as an implant mask for the first active region. The lightly doped source and drain regions of first conductivity type counterdope the lightly doped source and drain regions of second conductivity type in the second active region. Thereafter, the method includes removing the first and second masking layers, forming first spacers adjacent to the first gate and second spacers adjacent to the second gate, forming a third masking layer that covers the second active region and includes an opening above the first active region, implanting heavily doped source and drain regions into the first active region outside the first gate and first spacers, removing the third masking layer, forming a fourth masking layer that covers the first active region and includes an opening above the second active region, implanting heavily doped source and drain regions into the second active region outside the second gate and second spacers, removing the fourth masking layer, and applying a high-temperature anneal to drive-in and activate the implanted dopants.

Preferably, implanting the heavily doped source and drain regions of second conductivity type provides all doping for the first gate, and implanting the heavily doped source and drain regions of first conductivity type provides all doping for the second gate. It is also preferred that the gate material is polysilicon, the masking layers are photoresist, the first conductivity type is P-type and the second conductivity type is N-type.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
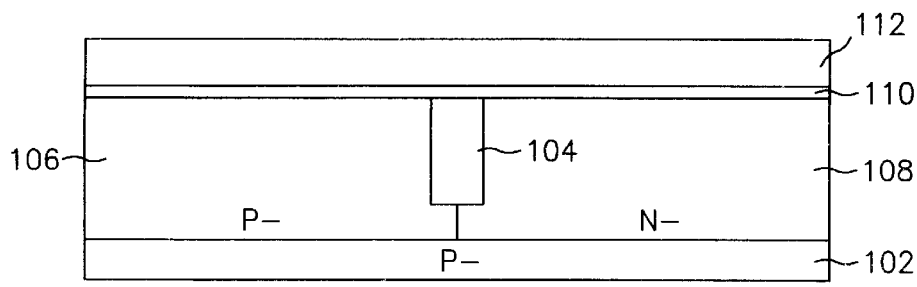
FIGS. 1A–1L show cross-sectional views of successive process steps for making N-channel and P-channel devices with reduced masking steps in accordance with an embodiment of the invention.

In the drawings, depicted elements are not necessarily drawn to scale and like or similar elements may be designated by the same reference numeral throughout the several views.

FIGS. 1A–1L show cross-sectional views of successive process steps for making N-channel and P-channel devices with reduced masking steps in accordance with an embodiment of the invention.

In FIG. 1A, silicon substrate 102 suitable for integrated circuit manufacture is provided. Substrate 102 includes a P-type epitaxial surface layer disposed on a P+ base layer (not shown). Substrate 102 contains trench oxide 104 that provides dielectric isolation between P– type NMOS region 106 and N– type PMOS region 108 in the epitaxial surface layer. NMOS region 106 has a boron background concentration on the order of $1 \times 10^{15}$ atoms/cm$^3$, a <100> orientation and a resistivity of 12 ohm-cm. PMOS region 108 has an arsenic background concentration on the order of $1 \times 10^{15}$ atoms/cm$^3$, a <100> orientation and a resistivity of 12 ohm-cm. A blanket layer of gate oxide 110, composed of silicon dioxide (SiO$_2$), is formed on the top surface of substrate 102 using tube growth at a temperature of 700 to 1000° C. in an O$_2$ containing ambient. Gate oxide 110 has a thickness in the range of 30 to 100 angstroms. Thereafter, a blanket layer of undoped polysilicon 112 is deposited by low pressure chemical vapor deposition on the top surface of gate oxide 110. Polysilicon 112 has a thickness of 2000 angstroms.

Figure 1B:
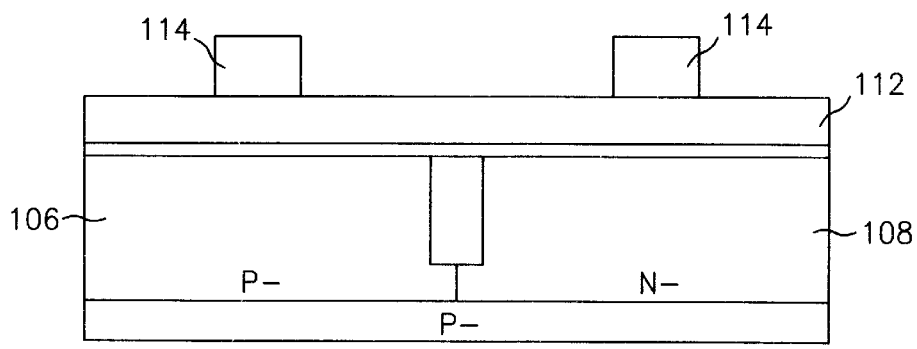

In FIG. 1B, photoresist layer 114 is deposited on polysilicon 112. A photolithographic system, such as a step and repeat optical projection system which generates deep ultraviolet light from a mercury-vapor lamp, uses a first reticle to irradiate photoresist layer 114 with a first image pattern. Thereafter, the irradiated portions of photoresist layer 114 are removed, and photoresist layer 114 includes openings above selected portions of NMOS region 106 and PMOS region 108.

Figure 1C:
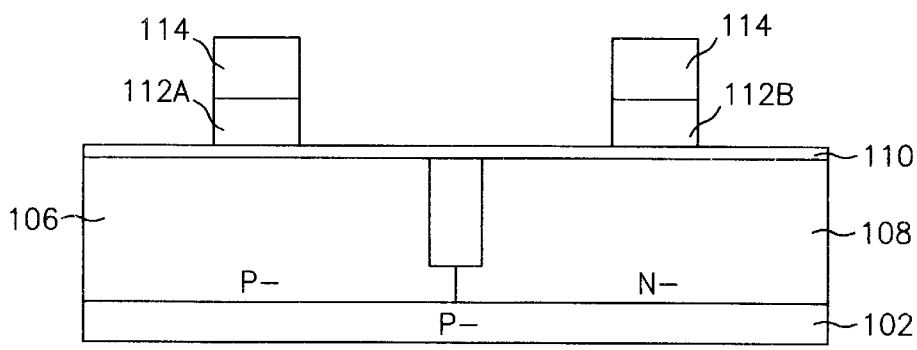

In FIG. 1C, an anisotropic dry etch is applied using photoresist layer 114 as an etch mask. Photoresist layer 114 protects the underlying regions of polysilicon 112, and the etch removes the regions of polysilicon 112 beneath the openings in photoresist layer 114. The etch is highly selective of polysilicon 112 with respect to gate oxide 110, so only a negligible amount of gate oxide 110 is removed and substrate 102 is unaffected. The etch forms first gate 112A of polysilicon 112 over NMOS region 106, and second gate 112B of polysilicon 112 over PMOS region 108. First gate 112A includes opposing vertical edges separated by a length of 3500 angstroms, and second gate 112B includes opposing vertical edges separated by a length of 3500 angstroms.

Figure 1D:
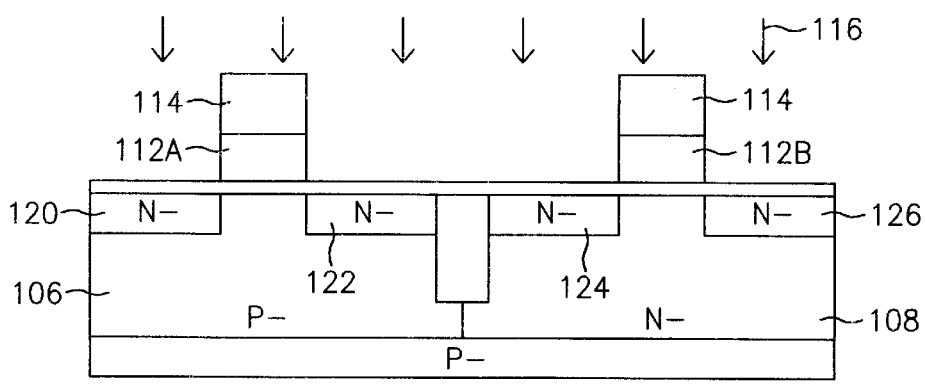

In FIG. 1D, lightly doped source and drain regions are implanted into NMOS region 106 and PMOS region 108 by subjecting the structure to ion implantation of phosphorus, indicated by arrows 116, at a dose in the range of $1 \times 10^{13}$ to $2.5 \times 10^{14}$ atoms/cm$^2$ and an energy in the range of 6 to 80 kiloelectron-volts, using photoresist layer 114 as an implant mask for first gate 112A and second gate 112B. As a result, lightly doped source/drain regions 120 and 122 are implanted in NMOS region 106 and are self-aligned to the opposing vertical edges of first gate 112A, and lightly doped source/drain regions 124 and 126 are implanted into PMOS region 108 and are self-aligned to the opposing vertical edges of second gate 112B. Lightly doped source/drain regions 120, 122, 124 and 126 are doped N– with a phosphorus concentration in the range of about $1 \times 10^{17}$ to $5 \times 10^{17}$ atoms/cm$^3$ and a depth in the range of 100 to 1500 angstroms.

Figure 1E:
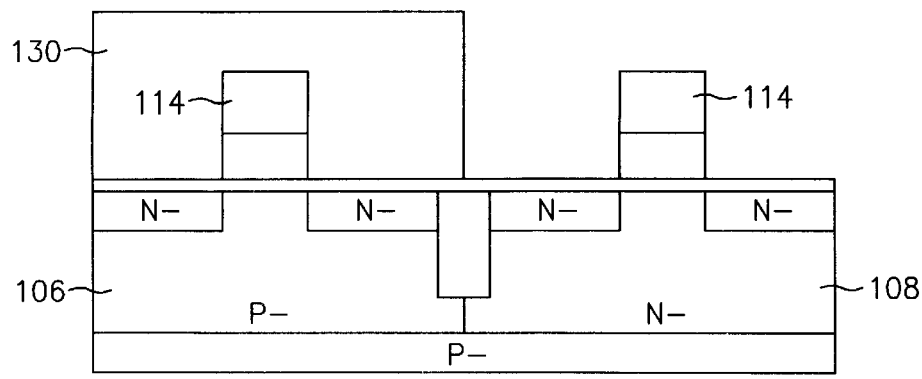

In FIG. 1E, photoresist layer 130 is deposited over NMOS region 106 and PMOS region 108. The photolithographic system uses a second reticle to irradiate photoresist layer 130 with a second image pattern. Thereafter, the irradiated portions of photoresist layer 130 are removed, and photoresist layer 130 covers the entire NMOS region 106 and includes an opening above the entire PMOS region 108.

Of importance, photoresist layer 114 is essentially unaffected by the deposition and patterning of photoresist layer 130. Photoresist layer 114 will have been previously subjected to a post-bake at an elevated temperature, as is conventional, after a developer removes the irradiated portions of photoresist layer 114, and before the anisotropic dry etch of polysilicon 112 occurs. The post-bake removes residual solvents from photoresist layer 114 in order to improve the adhesion and increase the etch resistance of photoresist layer 114. Accordingly, when the second image pattern irradiates photoresist layer 130, photoresist layer 114 is no longer capable of undergoing photochemical transformations that render it soluble to a subsequent developer.

Figure 1F:
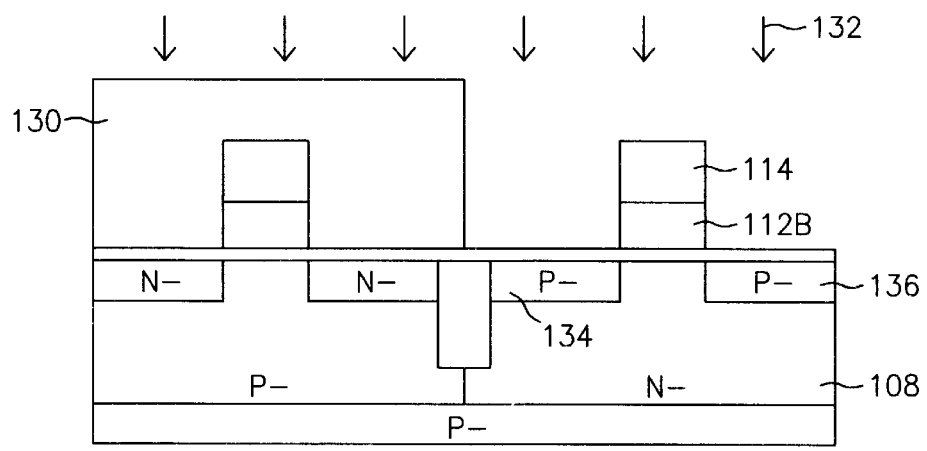

In FIG. 1F, lightly doped source and drain regions are implanted into PMOS region 108 by subjecting the structure to ion implantation of boron, indicated by arrows 132, at a dose in the range of $2 \times 10^{13}$ to $5 \times 10^{14}$ atoms/cm$^2$ and an energy in the range of 2 to 27 kiloelectron-volts using photoresist layer 114 as an implant mask for second gate 112B and photoresist layer 130 as an implant mask for NMOS region 106. As a result, lightly doped source/drain regions 134 and 136 are implanted in PMOS region 108, are self-aligned to the opposing vertical edges of second gate 112B, and counterdope lightly doped source/drain regions 124 and 126. Lightly doped source/drain regions 134 and 136 are doped P– with a boron concentration in the range of about $2 \times 10^{17}$ to $1 \times 10^{18}$ atoms/cm$^3$ and a depth in the range of 100 to 1500 angstroms.

The boron indicated by arrows 132 is implanted at a dosage that is approximately twice that of the phosphorus indicated by arrows 116 to assure that lightly doped source/drain regions 134 and 136 have a boron concentration that is approximately twice that of the phosphorus concentration in lightly doped source/drain regions 124 and 126. Furthermore, since the atomic weight of boron (10.81) is approximately one-third that of phosphorus (30.97), the boron indicated by arrows 132 is implanted at an energy that is approximately one-third that of the phosphorus indicated by arrows 116. In this manner, lightly doped source/drain regions 134 and 136 are implanted to approximately the same depth as and annihilate lightly doped source/drain regions 124 and 126.

Advantageously, source/drain regions 120, 122, 134 and 136 are provided with a single masking step. Moreover, neither gate 112A nor gate 112B is subjected to both N-type and P-type dopants. In fact, gates 112A and 112B remain undoped thus far.

Figure 1G:
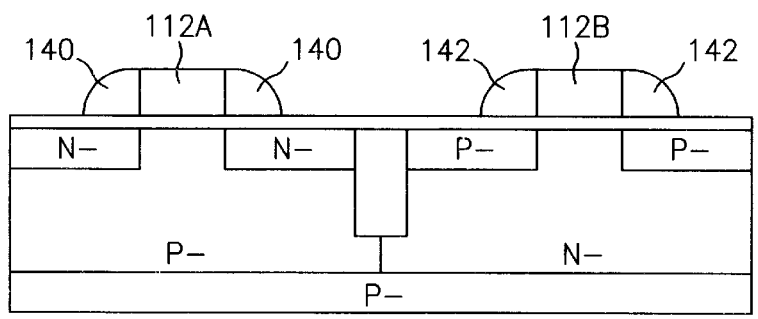

In FIG. 1G, photoresist layers 114 and 130 are stripped, and a silicon nitride (Si$_3$N$_4$) layer with a thickness of 2500 angstroms is conformally deposited over the exposed surfaces by plasma enhanced CVD at a temperature in the range of 300 to 450° C. Thereafter, the silicon nitride layer is subjected to an anisotropic reactive ion etch (RIE) that forms sidewall spacers 140 over NMOS region 106 and adjacent to the opposing vertical edges of first gate 112A, and sidewall spacers 142 over PMOS region 108 and adjacent to the opposing vertical edges of second gate 112B. Spacers 140 cover portions of lightly doped source/drain regions 120 and 122 adjacent to first gate 112A, and spacers 142 cover portions of lightly doped source/drain regions 134 and 136 adjacent to second gate 112B.

Figure 1H:
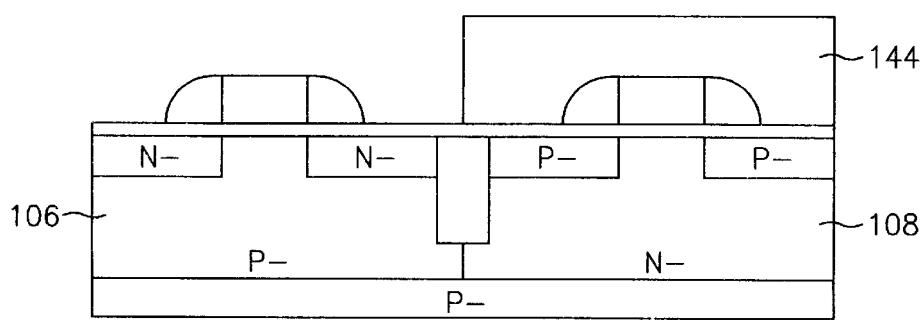

In FIG. 1H, photoresist layer 144 is deposited over NMOS region 106 and PMOS region 108. The photolithographic system uses a third reticle to irradiate photoresist layer 144 with a third image pattern. Thereafter, the irradiated portions of photoresist layer 144 are removed, and photoresist layer 144 covers the entire PMOS region 108 and includes an opening above the entire NMOS region 106.

Figure 1I:
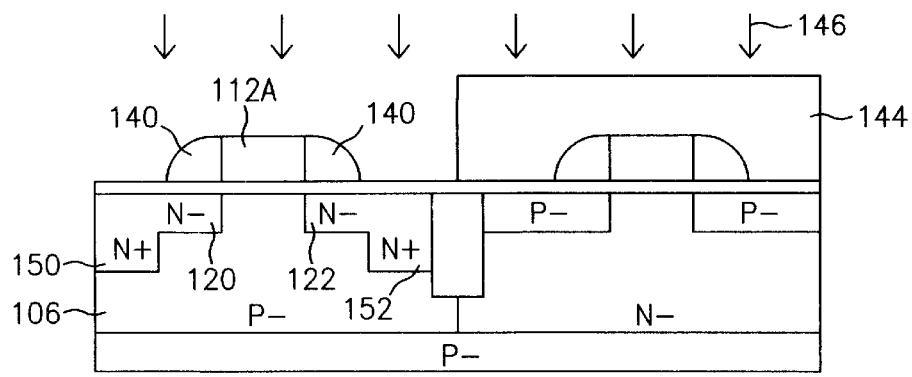

In FIG. 1I, heavily doped source and drain regions are implanted into NMOS region 106 by subjecting the structure to ion implantation of arsenic, indicated by arrows 146, at a dose in the range of $1 \times 10^{15}$ to $5 \times 10^{15}$ atoms/cm$^2$ and an energy in the range of 6 to 80 kiloelectron-volts, using first gate 112A and spacers 140 and photoresist layer 144 as an implant mask. As a result, heavily doped source/drain regions 150 and 152 are implanted in NMOS region 106 and are self-aligned to the outside edges of spacers 140. Heavily doped source/drain regions 150 and 152 are doped N+ with an arsenic concentration in the range of about $1 \times 10^{18}$ to $\times 10^{20}$ atoms/cm$^3$ and a depth in the range of 100 to 1500 angstroms. Preferably, the depth of heavily doped source/drain regions 150 and 152 exceeds that of lightly doped source/drain regions 120 and 122. In addition, the arsenic indicated by arrows 146 provides all doping for first gate 112A.

Figure 1J:
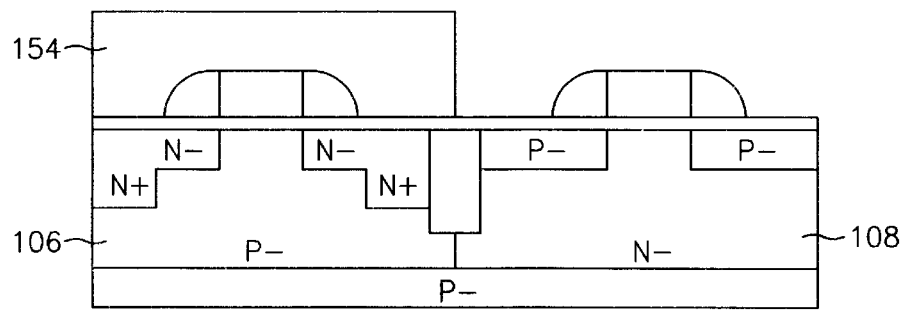

In FIG. 1J, photoresist layer 144 is stripped, and photoresist layer 154 is deposited over NMOS region 106 and PMOS region 108. The photolithographic system uses the second reticle to irradiate photoresist layer 154 with the second image pattern. Thereafter, photoresist layer 154 is developed and the irradiated portions of photoresist layer 154 are removed so that photoresist layer 154 covers the entire NMOS region 106 and includes an opening above the entire PMOS region 108.

Figure 1K:
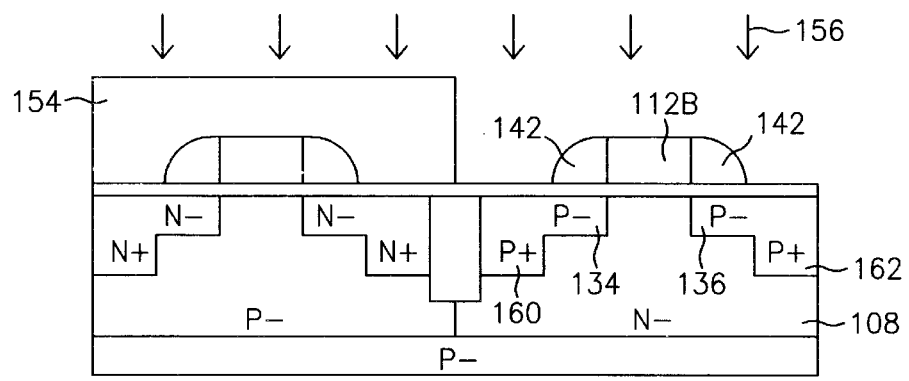

In FIG. 1K, heavily doped source and drain regions are implanted into PMOS region 108 by subjecting the structure to ion implantation of boron, indicated by arrows 156, at a dose in the range of $1 \times 10^{15}$ to $5 \times 10^{15}$ atoms/cm$^2$ and an energy in the range of 2 to 27 kiloelectron-volts, using second gate 112B and spacers 142 and photoresist layer 154 as an implant mask. As a result, heavily doped source/drain regions 160 and 162 are implanted in PMOS region 108 and are self-aligned to the outside edges of spacers 142. Heavily doped source/drain regions 160 and 162 are doped P+ with a boron concentration in the range of about $1 \times 10^{18}$ to $1 \times 10^{20}$ atoms/cm$^3$ and a depth in the range of 100 to 1500 angstroms. Preferably, the depth of heavily doped source/drain regions 160 and 162 exceeds that of lightly doped source/drain regions 134 and 136. In addition, the boron indicated by arrows 156 provides all doping for second gate 112B.

Figure 1L:
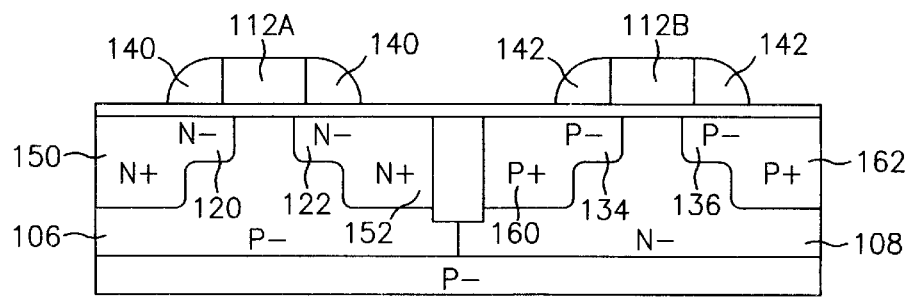

In FIG. 1L, photoresist layer 154 is stripped, and the device is annealed to remove crystalline damage and to drive-in and activate the implanted dopants by applying a rapid thermal anneal on the order of 950 to 1050° C. for 10 to 30 seconds. Regions 120 and 150 form a source and regions 122 and 152 form a drain for an NMOS device in NMOS region 106. Likewise, regions 134 and 160 form a source and regions 136 and 162 form a drain for a PMOS device in PMOS region 108. Since the dopants diffuse both vertically and laterally, heavily doped regions 150 and 152 extend partially beneath spacers 140, and heavily doped regions 160 and 162 extend partially beneath spacers 142. Similarly, lightly doped regions 120 and 122 extend slightly beneath first gate 112A, and lightly doped regions 134 and 136 extend slightly beneath second gate 112B.

Further processing steps in the fabrication of IGFETs typically include forming salicide contacts on the gates, sources and drains, forming a thick oxide layer over the active regions, forming contact windows in the oxide layer to expose the salicide contacts, forming interconnect metallization in the contact windows, and forming a passivation layer over the metallization. In addition, earlier or subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps apparent to those skilled in the art.

If desired, gates 112A and 112B can be electrically coupled so that the NMOS device in NMOS region 106 and the PMOS device in PMOS region 108 provide a CMOS inverter circuit.

Several advantages should be noted. Since first gate 112A is doped solely with arsenic and second gate 112B is doped solely with boron, neither gate is doped with both N-type and P-type dopants. Furthermore, although lightly doped source/drain regions 120 and 122 are doped with phosphorus, first gate 112A contains arsenic (a slow diffuser) without phosphorus (a fast diffuser), and arsenic is less likely than phosphorus to diffuse from gate 112A through gate oxide 110 into the channel region of NMOS region 106 during high-temperature processing.

The present invention includes numerous variations to the embodiment described above. The gate can be various conductors, the gate insulator and spacers can be various dielectrics, and the NMOS and PMOS regions can be isolated using various techniques such as LOCOS oxidation. The photoresist layers can pattern other masking layers to be used as the etch mask and/or implant mask. For instance, the first photoresist layer can pattern a silicon dioxide layer as the first masking layer, and the second photoresist layer can pattern a silicon nitride layer as the second masking layer. The LDDs are not essential. For instance, all source/drain doping for the NMOS and PMOS devices can be provided by the first two source/drain implants, although in this instance the polysilicon gates would need to be doped prior to the source/drain implants. The conductivities of the active regions and the implanted dopants can be reversed. Suitable N-type dopants include arsenic and phosphorus; suitable P-type dopants include boron $B_{10}$, boron $B_{11}$, and $BF_X$ species such as $BF_2$.

The invention is particularly well-suited for fabricating N-channel MOSFETs, P-channel MOSFETs and other types of IGFETs, particularly for high-performance microprocessors where high circuit density is essential. Although a single pair of N-channel and P-channel devices has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making N-channel and P-channel devices, comprising:

providing a semiconductor substrate with a first active region of first conductivity type and a second active region of second conductivity type;

forming a gate insulator over the semiconductor substrate;

forming a gate material over the gate insulator overlying the first and second active regions;

forming a first masking layer over the gate material;

etching the gate material using the first masking layer as an etch mask to form a first gate over the first active region and a second gate over the second active region;

implanting a dopant of second conductivity type into the first and second active regions using the first masking layer as an implant mask at a lightly-doped second conductivity-type dosage and to a second conductivity-type implant depth;

forming a second masking layer that covers the first active region and includes an opening above the second active region; and implanting a dopant of first conductivity type into the second active region using the first and second masking layers as an implant mask, the dopant of the first conductivity-type being implanted at a lightly-doped first conductivity-type dosage that is approximately twice the second conductivity-type dosage and being implanted to a first conductivity-type implant depth that is approximately the same as the second conductivity-type implant depth, the first masking layer and second masking layer protecting the first gate and the second gate so that neither the first gate nor the second gate are implanted with dopants of the lightly-doped first conductivity type and the lightly-doped second conductivity type.

2. The method of claim 1, wherein:

the first masking layer prevents implanting the dopant of the lightly-doped second conductivity type into the first and second gates;

the first masking layer prevents implanting the dopant of the lightly-doped first conductivity type into the second gate; and the second masking layer prevents implanting the dopant of the lightly-doped first conductivity type into the first gate.

3. The method of claim 1, wherein implanting the dopant of the lightly-doped first conductivity type counterdopes the dopant of the lightly-doped second conductivity type in the second active region.

4. The method of claim 1, wherein the first conductivity type is P-type and the second conductivity type is N-type.

5. The method of claim 1, wherein etching the gate material includes applying an anisotropic etch through openings in the first masking layer.

6. The method of claim 1, including:

removing the first and second masking layers;

forming first spacers adjacent to opposing edges of the first gate and second spacers adjacent to opposing edges of the second gate;

forming a third masking layer that covers the second active region and includes an opening above the first active region;

implanting a dopant of a heavily-doped second conductivity type into the first active region using the first gate and first spacers and third masking layer as an implant mask, the first gate being heavily-doped with the second conductivity type dopant;

removing the third masking layer;

forming a fourth masking layer that covers the first active region and includes an opening above the second active region; and implanting a dopant of a heavily-doped first conductivity type into the second active region using the second gate and second spacers and fourth masking layer as an implant mask, the second gate being heavily-doped with the second conductivity type dopant.

7. The method of claim 1, wherein the first and second masking layers are photoresist layers and the gate material is polysilicon.

8. The method of claim 1, wherein the N-channel and P-channel devices are adjacent to an isolation region in the substrate.

9. A method of making N-channel and P-channel devices, comprising:

providing a semiconductor substrate with first and second active regions adjacent to an isolation region, wherein the first active region is of first conductivity type and the second active region is of second conductivity type;

forming a gate insulator on the first and second active regions;

forming a polysilicon layer on the gate insulator;

forming a first photoresist layer over the polysilicon layer, wherein the first photoresist layer includes openings above portions of the first and second active regions;

etching the polysilicon layer using the first photoresist layer as an etch mask to form a first gate above the first active region and a second gate above the second active region;

implanting lightly-doped source and drain regions of second conductivity type into the first active region outside the first gate and into the second active region outside the second gate using the first photoresist layer as an implant mask for the first and second gates;

forming a second photoresist layer over the substrate, wherein the second photoresist layer covers the first active region and includes an opening above the second active region; and implanting lightly-doped source and drain regions of first conductivity type into the second active region outside the second gate using the first photoresist layer as an implant mask for the second gate and the second photoresist layer as an implant mask for the first active region, wherein the lightly-doped source and drain regions of first conductivity type are implanted with a dosage that is approximately twice the dosage and the same depth to which the lightly-doped source and drain regions of the second conductivity type are doped in the second active region outside the second gate to counterdope the lightly-doped source and drain regions of second conductivity type in the second active region outside the second gate, the first photoresist layer and second photoresist layer protecting the first gate and the second gate so that neither the first gate nor the second gate are implanted with dopants of the lightly-doped first conductivity type and the lightly-doped second conductivity type.

10. The method of claim 9, including:

removing the first photoresist layer and the second photoresist layer;

forming first spacers adjacent to opposing edges of the first gate and second spacers adjacent to opposing edges of the second gate after implanting the lightly doped source and drain regions of first conductivity type;

implanting heavily doped source and drain regions of second conductivity type into the first active region outside the first gate and first spacers; and implanting heavily doped source and drain regions of first conductivity type into the second active region outside the second gate and second spacers.

11. The method of claim 10, wherein:

implanting the heavily doped source and drain regions of second conductivity type implants an initial doping for the first gate; and implanting the heavily doped source and drain regions of first conductivity type implants an initial doping for the second gate.

12. The method of claim 9, wherein the first gate is devoid of dopants of the lightly-doped first conductivity type and the second gate is devoid of the lightly-doped dopants of second conductivity type.

13. The method of claim 9, wherein the first and second gates are electrically coupled.

14. The method of claim 9, wherein the N-channel and P-channel devices operate as an inverter circuit.

15. The method of claim 9, wherein the first conductivity type is N-type and the second conductivity type is P-type.

16. The method of claim 9, wherein the first conductivity type is P-type and the second conductivity type is N-type.

17. A method of making N-channel and P-channel devices, comprising the following sequence of operations:

providing a semiconductor substrate with first and second active regions adjacent to a top surface of the substrate and an isolation region in the substrate, wherein the first active region is of first conductivity type and the second active region is of second conductivity type;

forming a gate oxide on the first and second active regions;

forming a polysilicon layer on the gate oxide;

forming a first photoresist layer over the polysilicon layer, wherein the first photoresist layer includes openings above portions of the first and second active regions;

etching the polysilicon layer through the openings in the first photoresist layer using the first photoresist layer as an etch mask to form a first gate above the first active region and a second gate above the second active region;

implanting lightly doped source and drain regions of second conductivity type into the first active region outside the first gate and into the second active region outside the second gate using the first photoresist layer as an implant mask for the first and second gates;

forming a second photoresist layer over the substrate, wherein the second photoresist layer covers the first active region and includes an opening above the second active region;

implanting lightly doped source and drain regions of first conductivity type into the second active region outside the second gate using the first photoresist layer as an implant mask for the second gate and the second photoresist layer as an implant mask for the first active region, wherein the lightly doped source and drain regions of first conductivity type are implanted with a dosage that is approximately twice the dosage and the same depth to which the lightly doped source and drain regions of the second conductivity type are doped in the second active region outside the second gate to counterdope the lightly doped source and drain regions of second conductivity type in the second active region outside the second gate, the first photoresist layer and second photoresist layer protecting the first gate and the second gate so that neither the first gate nor the second gate are implanted with lightly-doped dopants of the first conductivity type and the second conductivity type;

removing the first and second photoresist layers;

depositing a spacer material over the substrate;

anisotropically etching the spacer material to provide first spacers adjacent to opposing sidewalls of the first gate and second spacers adjacent to opposing sidewalls of the second gate;

forming a third photoresist layer over the substrate, wherein the third photoresist layer covers the second active region and includes an opening above the first active region;

implanting heavily doped source and drain regions of second conductivity type into the first active region outside the first gate and first spacers using the third photoresist layer as an implant mask for the second active region;

removing the third photoresist layer;

forming a fourth photoresist layer over the substrate, wherein the fourth photoresist layer covers the first active region and includes an opening above the second active region;

implanting heavily doped source and drain regions of first conductivity type into the second active region outside the second gate and second spacers using the fourth photoresist mask as an implant mask for the first active region; and removing the fourth photoresist layer.

18. The method of claim 17, wherein:

implanting the heavily doped source and drain regions of second conductivity type provides all doping for the first gate; and implanting the heavily doped source and drain regions of first conductivity type provides all doping for the second gate.

19. The method of claim 17, including:

implanting the lightly doped source and drain regions of second conductivity type solely with phosphorus;

implanting the heavily doped source and drain regions of second conductivity type solely with arsenic; and doping the first gate solely with arsenic.

20. The method of claim 19, including:

implanting the heavily doped source and drain regions of first conductivity type solely with boron or boron difluoride; and doping the second gate solely with boron or boron difluoride.

21. The method of claim 17, wherein:

a source in the first active region includes the lightly and heavily doped source regions of second conductivity type in the first active region;

a drain in the first active region includes the lightly and heavily doped drain regions of second conductivity type in the first active region;

a source in the second active region includes the lightly and heavily doped source regions of first conductivity type in the second active region; and a drain in the second active region includes the lightly and heavily doped source and drain regions of first conductivity type in the second active region.

22. The method of claim 17, wherein the first conductivity type is P-type and the second conductivity type is N-type.

* * * * *